United States Patent
Rou

(10) Patent No.: US 10,366,921 B2
(45) Date of Patent: Jul. 30, 2019

(54) INTEGRATED CIRCUIT STRUCTURE INCLUDING FUSE AND METHOD THEREOF

(71) Applicant: UNITED MICROELECTRONICS CORP., Hsin-Chu (TW)

(72) Inventor: I-Cheng Rou, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 50 days.

(21) Appl. No.: 14/460,364

(22) Filed: Aug. 15, 2014

(65) Prior Publication Data

US 2016/0049367 A1 Feb. 18, 2016

(51) Int. Cl.
*H01L 21/768* (2006.01)
*H01L 23/522* (2006.01)
*H01L 23/525* (2006.01)

(52) U.S. Cl.
CPC ...... *H01L 21/76897* (2013.01); *H01L 23/522* (2013.01); *H01L 23/5258* (2013.01); *H01L 23/5256* (2013.01); *H01L 2924/0002* (2013.01)

(58) Field of Classification Search
CPC ............. H01L 23/5256; H01L 23/5258; H01L 21/31116; H01L 21/76897
See application file for complete search history.

(56) References Cited

U.S. PATENT DOCUMENTS

| | | | | |
|---|---|---|---|---|
| 5,235,205 A | * | 8/1993 | Lippitt, III | H01L 21/76894 257/528 |
| 5,729,041 A | * | 3/1998 | Yoo | H01L 21/76888 257/529 |
| 5,879,966 A | * | 3/1999 | Lee | H01L 23/5258 148/DIG. 55 |
| 6,121,073 A | * | 9/2000 | Huang | H01L 23/5258 257/E23.15 |
| 6,372,652 B1 | * | 4/2002 | Verma | H01L 23/5256 257/E23.149 |
| 6,624,514 B2 | * | 9/2003 | Kasai | H01L 21/76802 257/701 |
| 7,811,866 B2 | | 10/2010 | Tsai | |
| 7,829,392 B2 | * | 11/2010 | Choi | H01L 23/5258 257/529 |
| 8,921,975 B2 | * | 12/2014 | Anderson et al. | 257/529 |
| 2010/0117190 A1 | * | 5/2010 | Chuang | H01L 23/5256 257/529 |
| 2013/0056846 A1 | * | 3/2013 | Takeda | H01L 23/5256 257/529 |
| 2014/0106559 A1 | * | 4/2014 | Anderson | H01L 23/5256 438/601 |

* cited by examiner

*Primary Examiner* — Tuan A Hoang
(74) *Attorney, Agent, or Firm* — Winston Hsu

(57) ABSTRACT

An integrated circuit structure includes a fuse. The integrated circuit structure further includes a first dielectric layer and a patterned dummy. The fuse is disposed on a substrate. The first dielectric layer covers the fuse. The patterned dummy is disposed on the first dielectric layer and the patterned dummy has a first recess exposing a part of the first dielectric layer directly above the fuse. A method of forming the integrated circuit structure including a fuse is also provided.

6 Claims, 5 Drawing Sheets

INTEGRATED CIRCUIT STRUCTURE INCLUDING FUSE AND METHOD THEREOF

BACKGROUND OF THE INVENTION

1. Field of the Invention

The present invention relates generally to an integrated circuit structure including a fuse, and a method thereof, and more specifically to an integrated circuit structure including a fuse, and a method thereof, which applies a dummy right above the fuse.

2. Description of the Prior Art

As semiconductor processes become smaller and more complex, semiconductor components are more easily influenced by impurities. If a single metal link, a diode, or a MOS is broken down, the whole chip will be unusable. To treat this problem, fuses can be selectively blown to increase the yield of IC manufacturing.

Fused circuits are redundant circuits of an IC. When defects are found in a circuit, fuses can be selectively blown for repairing or replacing defective circuits. In addition, fuses provide the function of programming circuits for various customized functions. Fuses are classified into two categories based on their operation: thermal fuse and electrical fuse. Thermal fuses can be cut by lasers and linked by laser repair. An electrical fuse utilizes electro-migration both for forming open circuits and for repairing. The electrical fuse for semiconductor devices may be classified into categories of poly electrical fuse, MOS capacitor anti-fuse, diffusion fuse, contact electrical fuse, and contact anti-fuse.

In the conventional art, a protection layer is formed on a fuse for two purposes. The protection layer insulates the fuse from the external environment and also protects the fuse from corrosion. Furthermore, if a laser repair is performed, the protection layer insulates the heat absorbed by the fuse to thereby prevent it from escaping and achieve an effective burnout. Unfortunately, the thickness of the formed protection layer is difficult to be controlled precisely. Therefore, how to fabricate a fuse having an accurate predetermined thickness has become an important task in the field.

SUMMARY OF THE INVENTION

The present invention provides an integrated circuit structure including a fuse, and a method thereof, which applies a dummy directly above the fuse to prevent over-etching of a protection layer between the dummy and the fuse, so that the protection layer can retain a precise predetermined thickness to ensure the performance of the fuse.

The present invention provides an integrated circuit structure including a fuse. The integrated circuit structure further includes a first dielectric layer and a patterned dummy. The fuse is disposed on a substrate. The first dielectric layer covers the fuse. The patterned dummy is disposed on the first dielectric layer and the patterned dummy has a first recess exposing a part of the first dielectric layer directly above the fuse.

The present invention provides a method of forming an integrated circuit structure including a fuse, wherein the method includes the following steps. A fuse, a first dielectric layer, a dummy and a second dielectric layer are sequentially formed on a substrate, wherein the dummy is directly above the fuse. A first etching process is performed to remove a part of the second dielectric layer by using the dummy as an etch stop layer, so that a patterned second dielectric layer having a second recess is formed and a part of the dummy is exposed by the second recess. A second etching process is performed to remove the exposing part of the dummy by using the first dielectric layer as an etching stop layer, so that a patterned dummy having a first recess is formed and a part of the first dielectric layer directly above the fuse is exposed by the first recess.

As illustrated by the above, the present invention provides an integrated circuit structure including a fuse, and a method thereof, which forms a first dielectric layer directly on a fuse and then applies a dummy directly above the first dielectric layer. Therefore, the thickness of the first dielectric layer directly above the fuse can be controlled precisely by performing several etching processing steps using the dummy and the first dielectric layer as etching stop layers, as the dummy and the dielectric layer are composed of different materials.

These and other objectives of the present invention will no doubt become obvious to those of ordinary skill in the art after reading the following detailed description of the preferred embodiment that is illustrated in the various figures and drawings.

DETAILED DESCRIPTION

Embodiments of fuses such as a polysilicon fuse and a metal fuse are presented in the following. The present invention applying a dummy on a fuse to prevent over-etching can also be applied to other fuses. Furthermore, although only structures of a polysilicon fuse and a metal fuse are described in these embodiments, the polysilicon fuse and the metal fuse can be formed together with other structures such as transistors in the same processing steps. For example, the polysilicon fuse can be formed in the same process with a polysilicon gate of a transistor; the metal fuse can be formed in the same process with a metal interconnect for electrically connecting a transistor outwards.

Figure 1:
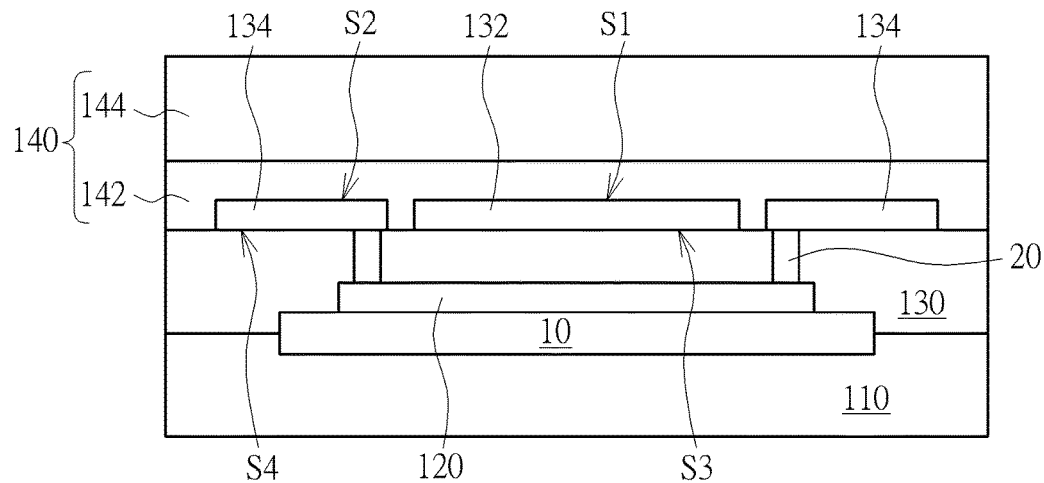
FIGS. 1-5 schematically depict cross-sectional views of a method of an integrated circuit structure including a polysilicon fuse according to an embodiment of the present invention.

FIGS. 1-5 schematically depict cross-sectional views of a method of an integrated circuit structure including a polysilicon fuse according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 may be optionally formed in the substrate 10. The isolation structure 10 may be a shallow trench isolation (STI) structure formed by a shallow trench isolation (STI) process, or a field oxide etc. A polysilicon fuse 120 is formed on and contacts the isolation structure 10, so that the polysilicon fuse 120 can be isolated from the substrate 110 by the isolation structure 10. Preferably, the size of the isolation structure 10 is larger than that of the polysilicon fuse 120, enabling the whole polysilicon fuse 120 to be on the isolation structure 10 directly so that edges of the isolation structure 10 protrude from the polysilicon fuse 120 for electrically isolating the polysilicon fuse 120 from the substrate 110.

A first dielectric layer 130 covers the polysilicon fuse 120, the isolation structure 10 and the substrate 110. The first dielectric layer 130 serves as a protection layer for preventing the polysilicon fuse 120 from being exposed to the air, thereby preventing heat absorbed by the polysilicon fuse 120 from escaping and burning out the polysilicon fuse 120, and also preventing the scrap of the polysilicon fuse 120 from splashing. The first dielectric layer 130 may be an oxide layer, but is not limited thereto. In this embodiment, the first dielectric layer 130 is an interdielectric layer, which may have MOS transistors or other active components formed therein. Contact plugs 20 are formed in the first dielectric layer 130. The contact plugs 20 may include a barrier layer and a metal, wherein the barrier layer may be composed of titanium or titanium nitride and the metal may be composed of copper, aluminum or tungsten. The steps of forming the contact plugs 20 may include, but are not limited to, the following. A first dielectric layer (not shown) may be deposited and planarized on the polysilicon fuse 120, the isolation structure 10 and the substrate 110. Then, the first dielectric layer is patterned to have contact holes (not shown) therein, to form the first dielectric layer 130. A barrier layer (not shown) and a metal (not shown) may cover the contact holes and the first dielectric layer 130 entirely. The metal and the barrier layer are planarized until the first dielectric layer 130 is exposed, to thereby form the contact plugs 20.

A dummy 132 and a first metal interconnect 134 may be formed on the first dielectric layer 130. The dummy 132 must be directly above the polysilicon fuse 120 to serve as an etch stop layer in later processes. The dummy 132 is floating for protecting the polysilicon fuse 120, and therefore does not electrically connect to other components such as the first metal interconnect 134. Preferably, the dummy 132 and the first metal interconnect 134 are in the same level, which simplifies the processing and saves on space. More preferably, the top surface S1 of the dummy 132 trims the top surface S2 of the first metal interconnect 134, and the bottom surface S3 of the dummy 132 trims the bottom surface S4 of the first metal interconnect 134. In this embodiment, the dummy 132 and the first metal interconnect 134 are formed in a same process, but this is not limited thereto. More precisely, the dummy 132 and the first metal interconnect 134 may be formed by a process of depositing and patterning one single metal layer. This means that the dummy 132 and the first metal interconnect 134 will be made of the same metal. The first metal interconnect 134 is aligned to physically contact the contact plugs 20, so that the first metal interconnect 134 can connect to the polysilicon fuse 120 via the contact plugs 20 through the first dielectric layer 130.

A second dielectric layer 140 covers the dummy 132, the first metal interconnect 134 and the first dielectric layer 130. The second dielectric layer 140 may include a single layer or multilayers, depending upon requirements. In this embodiment, the second dielectric layer 140 is a dual layer including a bottom layer 142 and a top layer 144. The bottom layer 142 is an inter-metal dielectric (IMD) layer composed of oxide and the top layer 144 is dielectric composed of phosphosilicate glass in the bottom and nitride in the top. Preferably, the top layer 144 has a phosphosilicate glass layer with a thickness of 5000 angstroms and a nitride layer with a thickness of 7000 angstroms, but it is not limited thereto.

Figure 2:
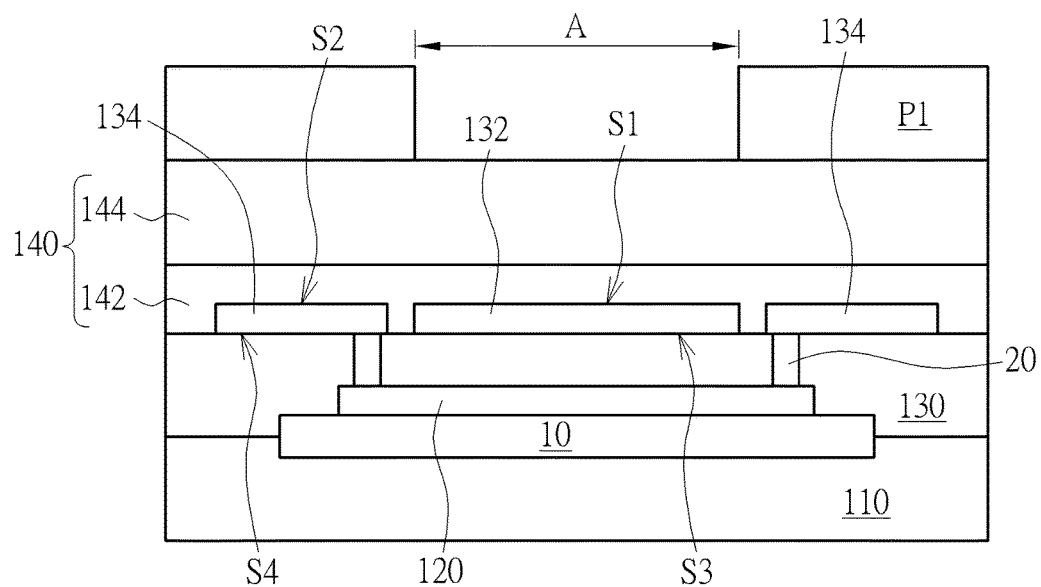

As shown in FIG. 2, a patterned photoresist P1 may be formed on the second dielectric layer 140 to expose a part A of the second dielectric layer 140 directly above the dummy 132. The patterned photoresist P1 may be formed by blanket coating and patterning a photoresist (not shown).

Figure 3:
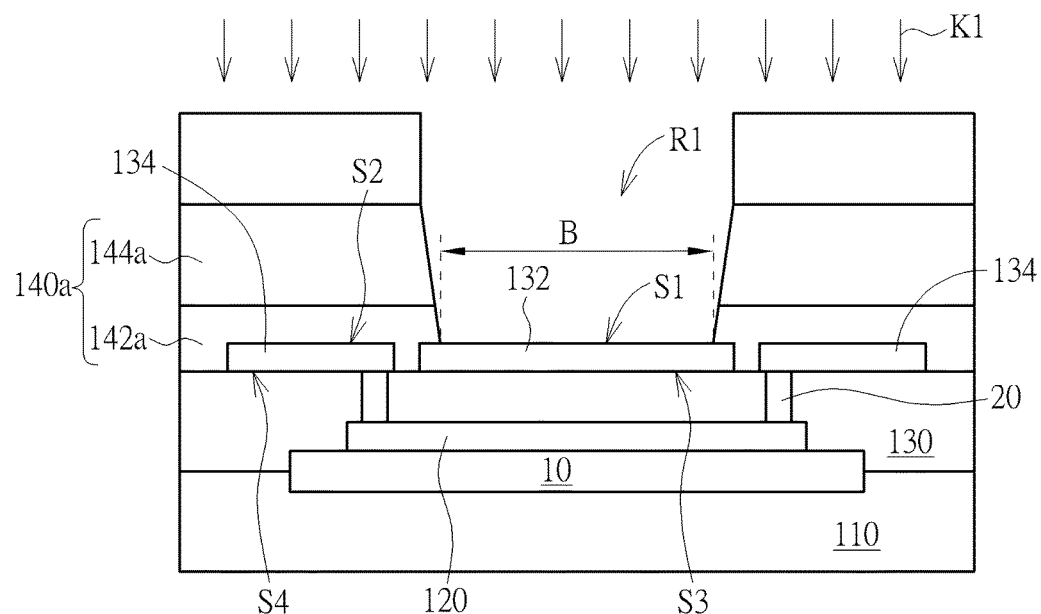

A first etching process K1 is then performed to remove part A of the second dielectric layer 140 directly above the dummy 132, as shown in FIG. 3. It should be emphasized that the first etching process K1 is performed to remove part A of the second dielectric layer 140 by using the dummy 132 as an etch stop layer, so that a patterned second dielectric layer 140a including a bottom layer 142a and a top layer 144a can be formed. Thus, the dummy 132 must have different materials from the second dielectric layer 140. As the second dielectric layer 140 is composed of dielectric, the dummy 132 must be composed of non-dielectric such as metals.

The patterned second dielectric layer 140a has a second recess R1 and a part B of the dummy 132 is exposed by the second recess R1. Since the dummy 132 serves as an etch stop layer, the etching rate of the first etching process K1 to the second dielectric layer 140 must be higher than that to the dummy 132. For instance, the first etching process may be a dry etching process containing fluorine which has an etching selectivity to the second dielectric layer 140 made of oxide and the dummy 132 made of copper. Preferably, the dry etching process containing fluorine includes carbon tetrafluoride ($CF_4$). Therefore, the first etching process K1 can have an etching rate to the second dielectric layer 140 15 times that to the dummy 132, so that the etching of the first etching process K1 can accurately stop on the dummy 132 without over-etching.

Figure 4:
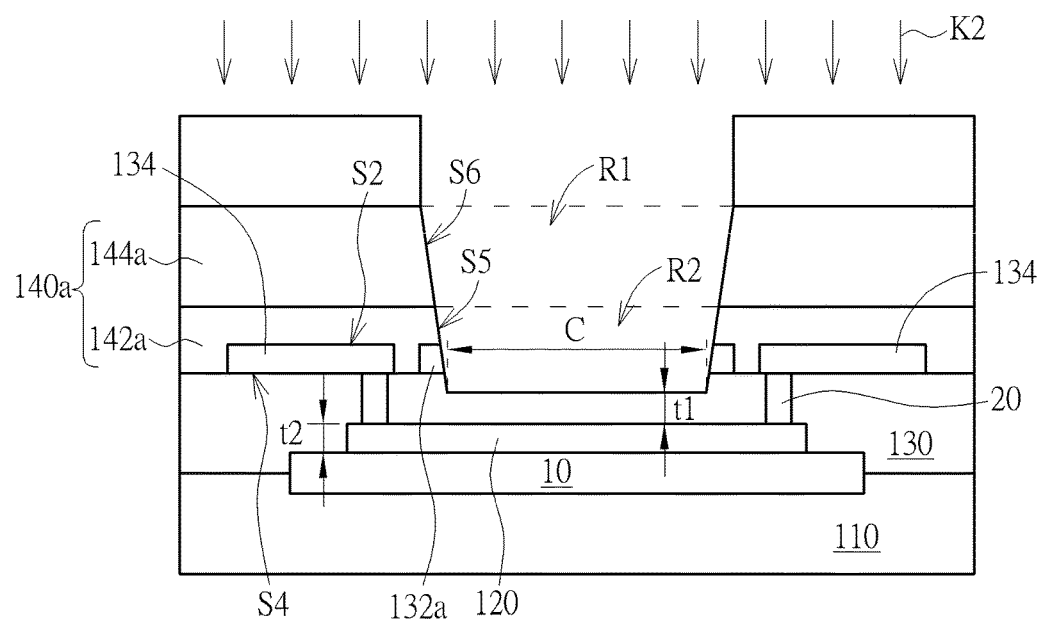

A second etching process K2 is then performed to remove the part B of the dummy 132 directly above the polysilicon fuse 120, as shown in FIG. 4. It should be emphasized that the second etching process K2 is performed to remove the part B of the dummy 132 by using the first dielectric layer 130 as an etch stop layer, so that a patterned dummy 132a having a first recess R2 is formed and a part C of the first dielectric layer 130 directly above the polysilicon fuse 120 is exposed by the first recess R2. Since the first dielectric layer 130 serves as an etch stop layer, the etching rate of the second etching process K2 to the dummy 132 must be higher than that to the first dielectric layer 130. The second etching process K2 may be a dry etching process, a wet etching process or a dry etching and then a wet etching process, depending upon requirements. For example, the second etching process K2 may be a dry etching process containing chloride as the dummy 132 is made of metal and the first dielectric layer 130 is made of oxide. The part B of the dummy 132 can therefore be removed completely while the first dielectric layer 130 remains due to the dry etching process containing chloride having a high selectivity to the dummy 132 and the first dielectric layer 130. In another embodiment, a wet etching process may further be performed after the dry etching process is performed to gain better control of the thickness t1 of the first dielectric layer 130 which remains directly above the polysilicon fuse 120. Preferably, the thickness t1 of the first dielectric layer 130 which remains directly above the polysilicon fuse 120 is larger than half the thickness t2 of the polysilicon fuse 120 but less than the thickness t2 of the polysilicon fuse 120. Therefore, the first dielectric layer 130 can cover and hold the polysilicon fuse 120 in its place while the laser heats it to a boiling temperature. If the thickness t1 of the first dielectric layer 130 is too thin, the first dielectric layer 130 will break too early and result in splashy cuts. If the thickness t1 of the first dielectric layer 130 is too thick, the first dielectric layer 130 cannot rupture at all or the polysilicon fuse 120 may crack. Preferably, the part C of the first dielectric layer 130 directly above the polysilicon fuse 120 has a thickness of 3000~6000 angstroms. Therefore, the polysilicon fuse 120 is not only well-protected from exposure to the external environment and corrosion, but the heat absorbed by the polysilicon fuse 120 can also be prevented from escaping, to thereby achieve an effective burnout.

In one case, sidewalls S5 of the first recess R2 preferably trim sidewalls S6 of the second recess R1 to ensure the patterned dummy 132a remains to thereby prevent the first metal interconnect 134 or the contact plugs 20 from being exposed. Furthermore, the second recess R1 and the first recess R2 preferably have tapered cross-sectional profiles; thus, the area of part A is larger than the area of part B, and the area of part B is larger than the area of part C.

Figure 5:
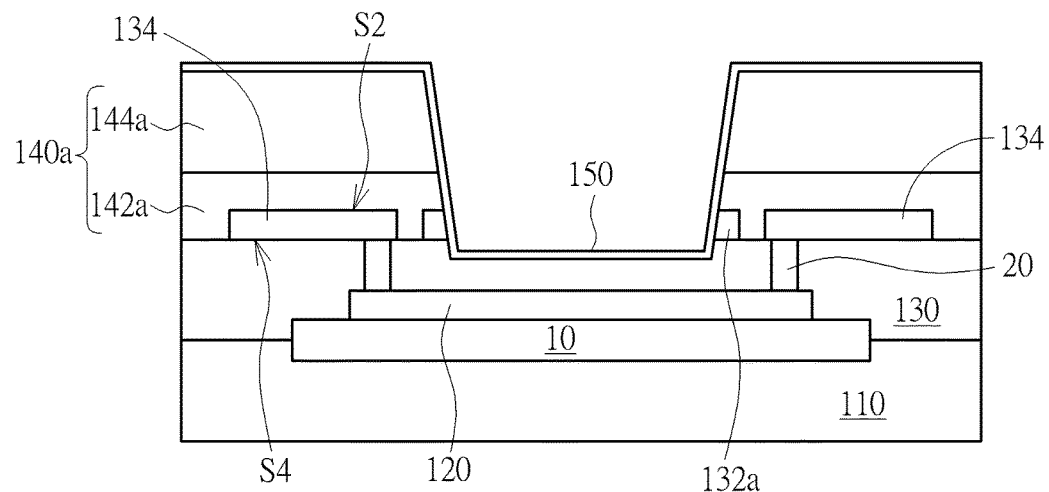

The patterned photoresist P1 is then removed. A passivation layer 150 covers the patterned second dielectric layer 140a, the patterned dummy 132a and the first dielectric layer 130 to prevent corrosion, as shown in FIG. 5. The passivation layer 150 may be composed of phosphosilicate glass, but it is not limited thereto.

An embodiment of a polysilicon fuse applying the present invention is provided. The thickness t1 of the first dielectric layer 130 directly on the polysilicon fuse 120 can be controlled precisely by forming the dummy 132 directly above. The present invention can also be applied to a metal fuse, which is presented below. For simplifying the present invention, similar symbols representing similar components are used in the following embodiment as in the above embodiment of a polysilicon fuse.

Figure 6:
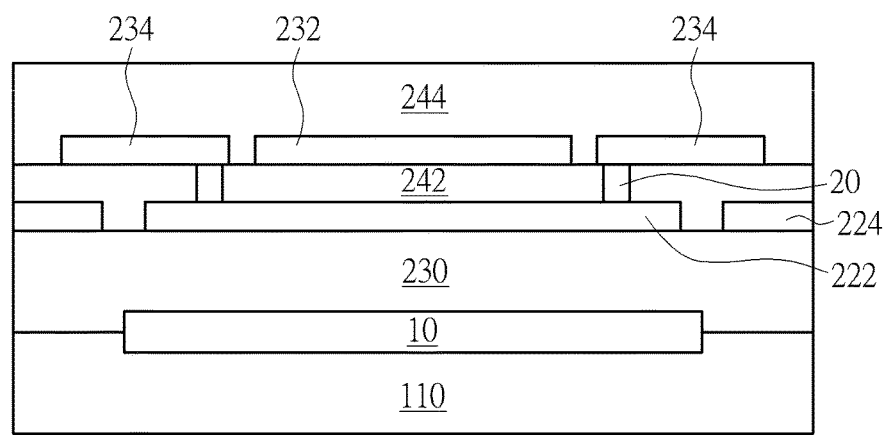
FIGS. 6-10 schematically depict cross-sectional views of a method of an integrated circuit structure including a metal fuse according to an embodiment of the present invention.

FIGS. 6-10 schematically depict cross-sectional views of a method of forming an integrated circuit structure including a metal fuse according to an embodiment of the present invention. As shown in FIG. 6, an isolation structure 10 may optionally be formed in a substrate 110. A dielectric layer 230 covers the isolation structure 10 and the substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate; the isolation structure 10 may be a shallow trench isolation (STI) structure formed by a shallow trench isolation (STI) process, or a field oxide; and the dielectric layer 230 may be an oxide layer. In this embodiment, the dielectric layer 230 is an interdielectric layer, which may have MOS transistors or active components therein, but it is not limited thereto.

A metal fuse 222 is formed on the dielectric layer 230 by a method s such as depositing and patterning a metal layer (not shown) covering the dielectric layer 230. Furthermore, the metal fuse 222 may be formed together and arranged with a first metal interconnect 224 by the same process, so that the metal fuse 222 and the first metal interconnect 224 are in the same level and are composed of the same metal. A first dielectric layer 242 covers the metal fuse 220 and the dielectric layer 230. The first dielectric layer 242 may be an oxide layer, and the first dielectric layer 242 is an inter-metal dielectric (IMD) layer in this embodiment, but it is not limited thereto. It should be noted that the first dielectric layer 242 serves as a protection layer for preventing the metal fuse 222 from being exposed to the air, thereby preventing heat absorbed by the metal fuse 222 from escaping. The metal fuse 222 can therefore be burned out while preventing the scrap of the metal fuse 222 from splashing.

A dummy 232 is formed on the first dielectric layer 242 and directly above the metal fuse 220 to serve as an etch stop layer in later processes. The dummy 232 is floating for protecting the metal fuse 220 so that it does not electrically connect to other components. In this embodiment, the dummy 232 is formed together and arranged with a second metal interconnect 234 by the same process, so that the dummy 232 and the second metal interconnect 234 are in the same level and are composed of the same metal. The second metal interconnect 234 connects the metal fuse 220 via contact plugs 20 through the first dielectric layer 242. The material and structure of the contact plugs 20 are described in the above embodiment. A second dielectric layer 244 covers the dummy 232, the first dielectric layer 242 and the second metal interconnect 234. The second dielectric layer 244 may be a dielectric composed of phosphosilicate glass in the bottom and nitride in the top. Preferably, the top layer has a phosphosilicate glass layer with a thickness of 5000 angstroms and a nitride layer with a thickness of 7000 angstroms, but it is not limited thereto.

Figure 7:
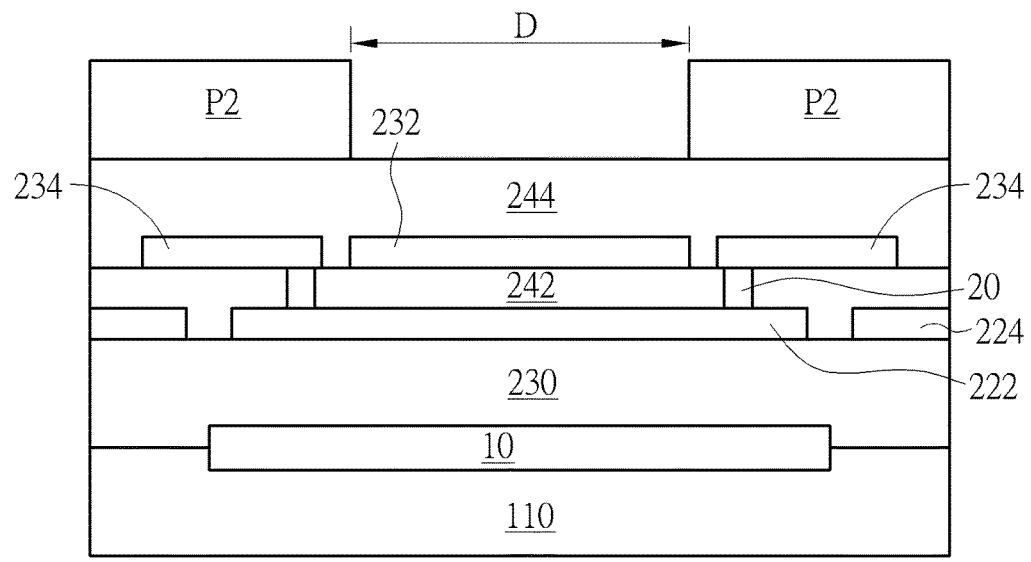

As shown in FIG. 7, a patterned photoresist P2 may be formed on the second dielectric layer 244 to expose a part D of the second dielectric layer 244 directly above the dummy 232. The patterned photoresist P2 may be formed by blanket coating and patterning, but it is not limited thereto.

Figure 8:
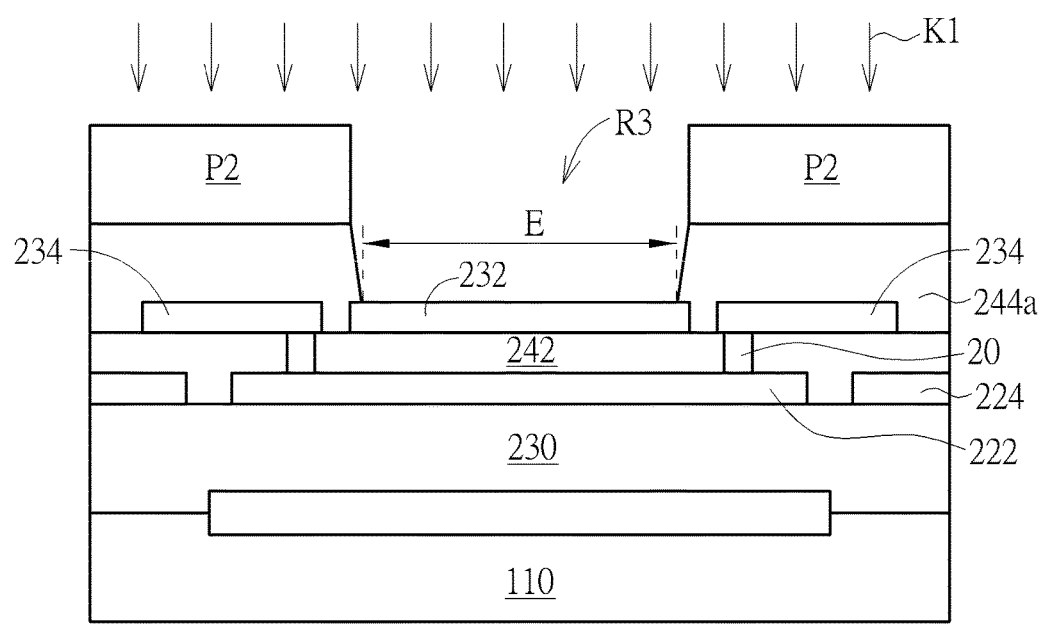

A first etching process K1 is performed to remove part D of the second dielectric layer 244 directly above the dummy 232 by using the dummy 232 as an etch stop layer, as shown in FIG. 8. A patterned second dielectric layer 244a having a second recess R3 is thereby formed, and a part E of the dummy 232 will be exposed by the second recess R3. Thus, the dummy 232 must have different materials from the second dielectric layer 244. As the second dielectric layer 244 is composed of dielectric, the dummy 232 must be composed of non-dielectric such as metals. Since the dummy 232 serves as an etch stop layer, the etching rate of the first etching process K1 to the second dielectric layer 244 must be higher than that to the dummy 232. For instance, the first etching process may be a dry etching process containing fluorine, which has etching selectivity to the second dielectric layer 244 made of dielectric and the dummy 232 made of metal. Preferably, the dry etching process containing fluorine includes carbon tetrafluoride ($CF_4$). Therefore, the first etching process K1 can have an etching rate to the second dielectric layer 244 15 times that to the dummy 232. The etching of the first etching process K1 can accurately stop on the dummy 232 without over-etching.

Figure 9:
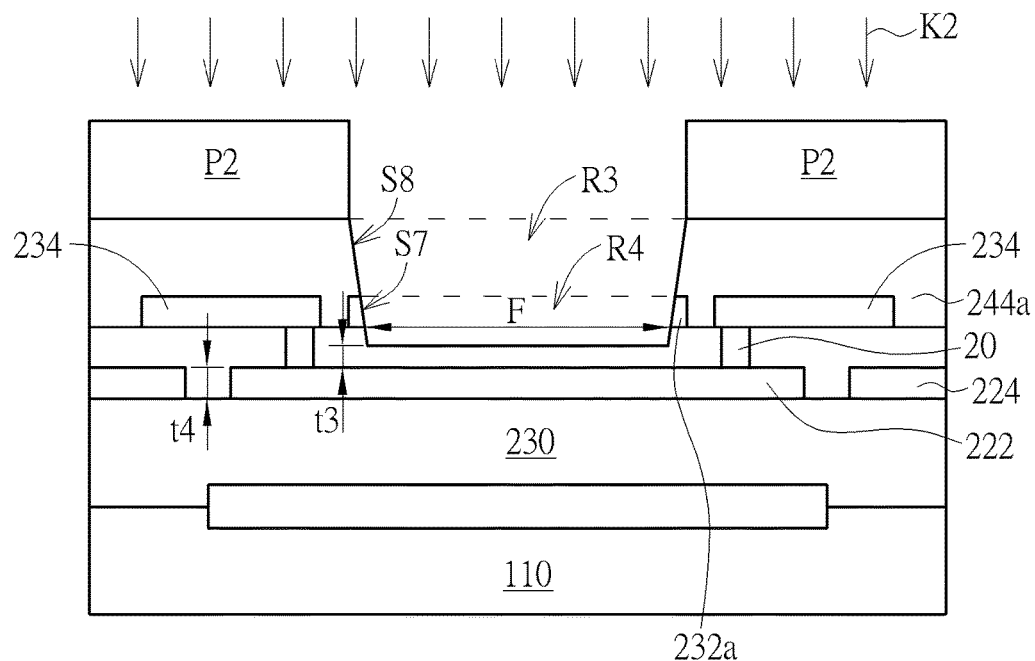

A second etching process K2 is then performed to remove the part E of the dummy 232 directly above the metal fuse 222 by using the first dielectric layer 242 as an etch stop layer, as shown in FIG. 9. A patterned dummy 232a having a first recess R4 is thereby formed and a part F of the first dielectric layer 242 directly above the metal fuse 222 will be exposed by the first recess R4.

Since the first dielectric layer 242 serves as an etch stop layer, the etching rate of the second etching process K2 to the dummy 232 must be higher than that to the first dielectric layer 242. The second etching process K2 may be a dry etching process, a wet etching process or a dry etching and then a wet etching process, depending upon requirements. For example, the second etching process K2 may be a dry etching process containing chloride as the dummy 232 is made of metal while the first dielectric layer 242 is made of oxide. Part F of the dummy 232 can therefore be removed completely while the first dielectric layer 242 remains. In another embodiment, a wet etching process may further be performed after the dry etching process is performed to enable better control of the thickness t3 of the first dielectric layer 242 which remains directly above the metal fuse 222. Preferably, the thickness t3 of the first dielectric layer 242 remaining directly above the metal fuse 222 is larger than half the thickness t4 of the metal fuse 222 but less than the thickness t4 of the metal fuse 222. Therefore, the first dielectric layer 242 can cover and hold the metal fuse 222 in its place while the laser heats it to a boiling temperature. If the thickness t3 of the first dielectric layer 242 is too thin, the first dielectric layer 242 will break too early, resulting in splashy cuts. If the thickness t3 of the first dielectric layer 242 is too thick, the first dielectric layer 242 cannot rupture at all, or the metal fuse 222 may crack. Still preferably, the part F of the first dielectric layer 242 directly above the metal fuse 222 has a thickness of 3000~6000 angstroms. The metal fuse 222 is not only well-protected from exposure to the external environment and corrosion, but heat absorbed by metal fuse 222 can also be prevented from escaping, thus achieving an effective burnout.

In one case, sidewalls S7 of the first recess R4 preferably trim sidewalls S8 of the second recess R3 to ensure the patterned dummy 232a remains and prevents the second metal interconnect 234, the first metal interconnect 224 or the contact plugs 20 from being exposed. The second recess R3 and the first recess R4 all have tapered cross-sectional profiles; thus, the area of part D is larger than the area of part E, and the area of part E is larger than the area of part F. Then, the patterned photoresist P2 is removed.

Figure 10:
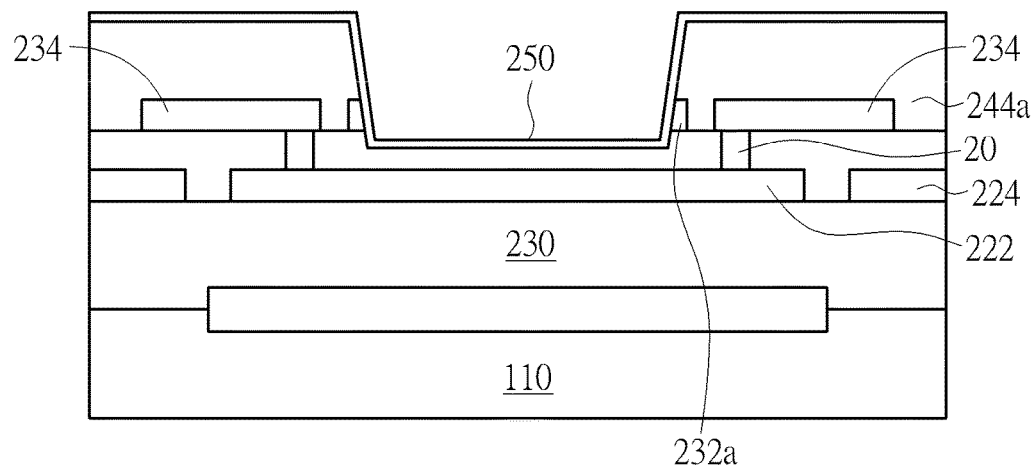

As shown in FIG. 10, a passivation layer 250 may cover the patterned second dielectric layer 244a, the patterned dummy 232a and the first dielectric layer 242 for preventing corrosion. The passivation layer 250 may be composed of phosphosilicate glass, but it is not limited thereto.

To summarize, the present invention provides an integrated circuit structure including a fuse, and a method thereof, which forms a first dielectric layer directly on a fuse such as a metal fuse or a polysilicon fuse and then applies a dummy directly above the first dielectric layer. The thickness of the first dielectric layer directly above the fuse can be controlled precisely by performing several etching processes steps using the dummy and the first dielectric layer as etching stop layers. Furthermore, the dummy can be formed together with an interconnect by the same process; this reduces the complexity of the process without increasing the processing costs.

As the dummy is composed of metal while the first dielectric layer is composed of dielectric, a dry etching process containing fluorine (wherein the etching rate to dielectric is higher than to metal) may be performed to etch dielectric layers such as the second dielectric layer above the dummy and stop on the dummy. Then, a dry etching process containing chloride (wherein the etching rate to metal is higher than to dielectric) may be performed to etch the dummy and stop on the first dielectric layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit structure comprising a fuse, comprising:
    a fuse and a first metal interconnect disposed on a substrate and in a first dielectric layer, wherein the first dielectric layer is one single layer;
    a patterned dummy disposed on the first dielectric layer, the patterned dummy having a first hole exposing a part of the first dielectric layer right above the fuse without contacting the fuse, wherein the first hole passes through the patterned dummy and only a top part of the first dielectric layer right above the part of the first dielectric layer;
    a second metal interconnect disposed in the same level as the patterned dummy, and the second metal interconnect and the patterned dummy being composed of same material, wherein the second metal interconnect connects the fuse by contact plugs through the first dielectric layer, and the contact plugs comprise different materials from the second metal interconnect and the fuse, wherein each of the contact plugs includes a barrier layer containing titanium or titanium nitride and a metal layer while the fuse and the second metal interconnect are composed of a single metal, and the second metal interconnect and the fuse are spaced apart, wherein the second metal interconnect is directly on the contact plugs, and the contact plugs are directly on the fuse, and a surface interface is disposed between the second metal interconnect and the contact plugs, and an another surface interface is disposed between the contact plugs and the fuse;
    a passivation layer directly and fully covering the patterned dummy, an exposed sidewall of the top part of the first dielectric layer in the first hole, a top surface of the part of the first dielectric layer in the first hole, a top surface of the second dielectric layer, and an exposed sidewall of the second dielectric layer in the first hole; and
    an isolation structure overlapping the fuse disposed underneath thereof and being separated by a dielectric layer therebetween.

2. The integrated circuit structure comprising a fuse according to claim 1, wherein the fuse comprises a metal fuse.

3. The integrated circuit structure comprising a fuse according to claim 2, further comprising:
    the first metal interconnect in the same level as the metal fuse.

4. The integrated circuit structure comprising a fuse according to claim 2, wherein the dielectric layer is an interdielectric layer sandwiched by the metal fuse and the substrate.

5. The integrated circuit structure comprising a fuse according to claim 1, further comprising:
    a patterned second dielectric layer disposed on the patterned dummy and the first dielectric layer wherein the patterned second dielectric layer has a second hole exposing the first hole of the patterned dummy and exposing the part of the first dielectric layer directly above the fuse.

6. The integrated circuit structure comprising a fuse according to claim 1, wherein the part of the first dielectric layer directly above the fuse has a thickness of 3000~6000 angstroms.

* * * * *